United States Patent
Marzuki et al.

(10) Patent No.: US 8,232,512 B2
(45) Date of Patent: Jul. 31, 2012

(54) METHOD AND APPARATUS FOR INTEGRATING A QUANTITY OF LIGHT

(75) Inventors: Arjuna Bin Marzuki, Kudah (MY); Kwai Lee Pang, Perak (MY); Len-Li Kevin Lim, Perak (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 1470 days.

(21) Appl. No.: 11/402,078

(22) Filed: Apr. 10, 2006

(65) Prior Publication Data

US 2007/0235632 A1   Oct. 11, 2007

(51) Int. Cl.
*H01J 40/14* (2006.01)
*H03F 3/08* (2006.01)

(52) U.S. Cl. ............. 250/205; 250/214 A; 250/214 SW; 315/150

(58) Field of Classification Search ................... 250/205, 250/214.1, 214 R, 214 SW, 214 A; 315/149, 315/150
See application file for complete search history.

(56) References Cited

U.S. PATENT DOCUMENTS

| | | | | |
|---|---|---|---|---|
| 5,430,290 A | * | 7/1995 | Merle et al. | 250/208.1 |
| 5,461,425 A | * | 10/1995 | Fowler et al. | 348/294 |
| 5,751,005 A | * | 5/1998 | Wyles et al. | 250/370.06 |
| 6,201,573 B1 | * | 3/2001 | Mizuno | 348/308 |
| 6,600,146 B2 | * | 7/2003 | Osako et al. | 250/214 LS |
| 7,095,435 B1 | * | 8/2006 | Hartman et al. | 348/222.1 |
| 2002/0113192 A1 | * | 8/2002 | Antila | 250/205 |
| 2004/0182990 A1 | * | 9/2004 | Dai | 250/208.1 |
| 2005/0199784 A1 | * | 9/2005 | Jaffar et al. | 250/214 R |
| 2006/0262055 A1 | * | 11/2006 | Takahara | 345/81 |

FOREIGN PATENT DOCUMENTS

| | | |
|---|---|---|
| JP | 11327454 | 11/1999 |
| JP | 2004296458 | 10/2004 |

* cited by examiner

*Primary Examiner* — John Lee

(57) ABSTRACT

In one embodiment, apparatus for integrating a quantity of light is provided with a photosensor, an integration capacitor, and a transfer amplifier. The transfer amplifier has i) an input coupled to receive a voltage determined by the integration capacitor, and ii) an output. The apparatus is further provided with a first switch to pull the integration capacitor to a precharge voltage, and a second switch to couple the integration capacitor to the photosensor, to discharge the integration capacitor in proportion to a quantity of light that is incident on the photosensor. Other embodiments are also disclosed.

18 Claims, 6 Drawing Sheets

METHOD AND APPARATUS FOR INTEGRATING A QUANTITY OF LIGHT

BACKGROUND

For many years, liquid crystal displays (LCDs) were commonly backlit using cold cathode fluorescent lamps (CCFLs). However, with increasing frequency, CCFL backlights are being replaced with light emitting diode (LED) backlights.

Typically, the LEDs that are used to backlight an LCD are driven by one or more pulse-width modulated (PWM) drive signals. The brightness of the backlight can then be regulated by sensing the light production of the backlight and regulating the duty cycle of the PWM drive signals in response thereto.

Often, the light production of a backlight is determined by means of a circuit 600 including a photodiode 602 (FIG. 6). The output of the photodiode 602 is coupled to a transimpedance amplifier 604, and the output of the transimpedance amplifier 604 is coupled to a low-pass filter (RC). However, this arrangement is not particularly suited for sensing the light production of a pulsating light source. For example, the input to the transimpedance amplifier 602 can oscillate—particularly when the feedback resistance (Rf) of the transimpedance amplifier 604 is large and the pulsating intensity of incident light on the photodiode 602 is low. Further, the time constant of the low-pass filter can result in a slow response time. The circuit 600 can also be expensive, as the resistor (R) and capacitor (C) of the low-pass filter cannot be practically realized in silicon.

SUMMARY OF THE INVENTION

In one embodiment, apparatus for integrating a quantity of light comprises a photosensor, an integration capacitor, and a transfer amplifier. The transfer amplifier has i) an input coupled to receive a voltage determined by the integration capacitor, and ii) an output. The apparatus further comprises a first switch to pull the integration capacitor to a precharge voltage, and a second switch to couple the integration capacitor to the photosensor, to discharge the integration capacitor in proportion to a quantity of light that is incident on the photosensor.

In another embodiment, a method for integrating a quantity of light comprises 1) during a precharge phase, pulling an integration capacitor to a precharge voltage; 2) during an integration phase, following the precharge period, discharging a charge on the integration capacitor in response to a quantity of light incident on a photosensor; and 3) at an end of the integration phase, reading a voltage determined by a charge remaining on the integration capacitor after said discharging.

Other embodiments are also disclosed.

BRIEF DESCRIPTION OF THE DRAWINGS

Illustrative embodiments of the invention are illustrated in the drawings, in which.

DETAILED DESCRIPTION

Figure 1:
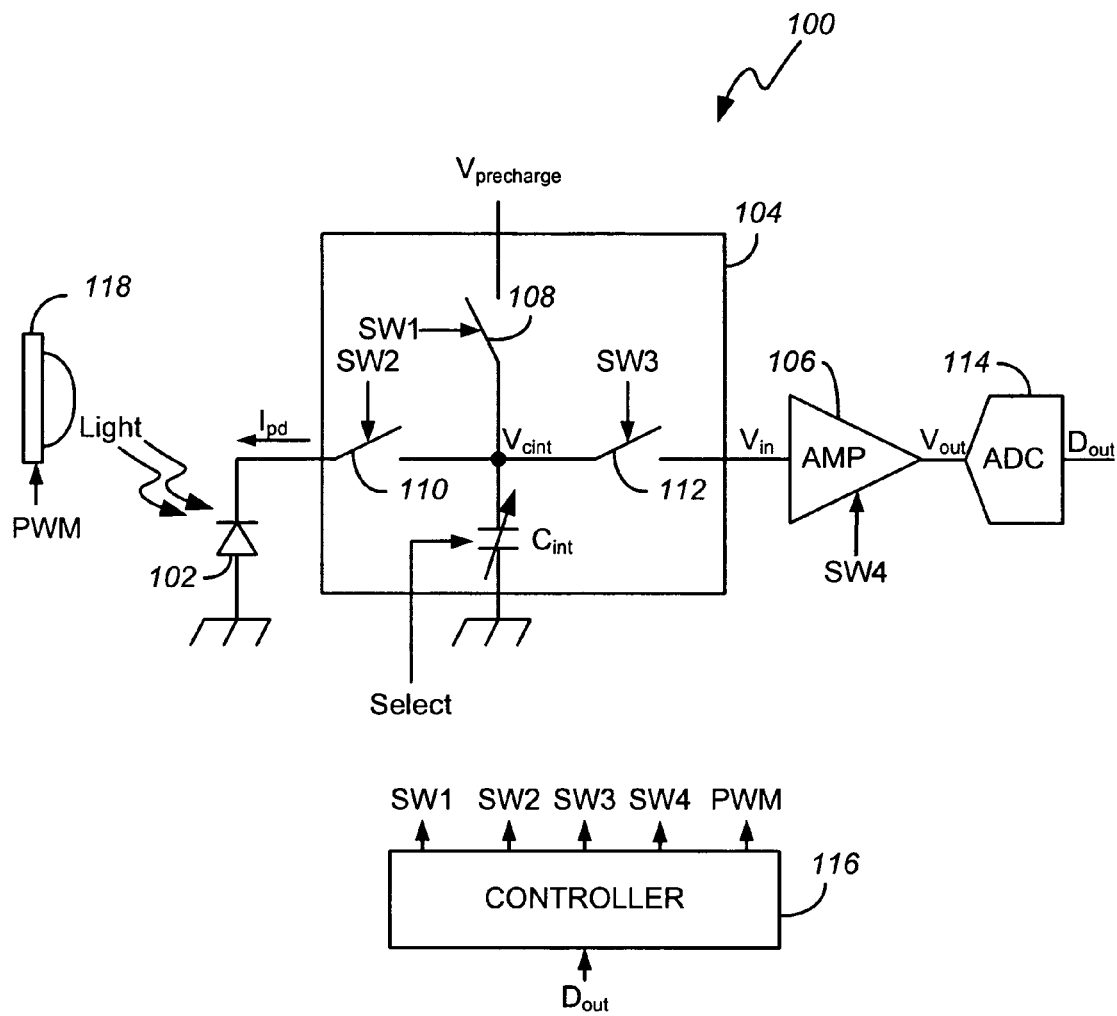
FIG. 1 illustrates exemplary apparatus for integrating a quantity of light.

FIG. 1 illustrates exemplary apparatus 100 for integrating a quantity of light incident on a photosensor 102. The apparatus 100 is especially suited to integrating a pulsating light and producing a signal, $V_{out}$, corresponding to the average thereof.

As shown in FIG. 1, the apparatus 100 comprises a photosensor 102. By way of example, the photosensor 102 is shown to be a photodiode. However, the photosensor 102 may alternately take the form of a phototransistor or other photosensing means. In some cases, a filter (e.g., a coating or plastic element) may be applied to or positioned over the photosensor 102 so as to limit the range of light wavelengths that are sensed by the photosensor—especially in the case where separate photosensors 102 (and sets of apparatus 100) are provided to sense different colored wavelengths of a mixed light, such as a white light.

The apparatus 100 further comprises an integration means 104 and an output means. The integration means may comprise an integration capacitor ($C_{int}$), or other capacitive means, for integrating a quantity of light that is incident on the photosensor 102 during an integration phase of the apparatus 100. The integration means 104 may further comprise a means, such as a switch (SW1; 108), for precharging the integration capacitor to a precharge voltage ($V_{precharge}$). The integration means 104 may also comprise a switch (SW2; 110) to couple the integration capacitor to the photosensor 102. When the switch SW2 is closed, the integration capacitor is discharged in proportion to a quantity of light that is incident on the photosensor 102.

The output means may comprise a transfer amplifier 106 having 1) an input ($V_{in}$) coupled to receive a voltage ($V_{cint}$) determined by the integration capacitor ($C_{int}$), and 2) an output ($V_{out}$). In one embodiment, the output means may further comprise an analog-to-digital converter (ADC 114) that is coupled to receive and convert the output of the transfer amplifier 106 to a digital value ($D_{out}$).

In one embodiment (not shown), one node of the integration capacitor ($C_{int}$) may be coupled directly to the input ($V_{in}$) of the transfer amplifier 106. However, in a preferred embodiment, the integration capacitor is coupled and decoupled to the transfer amplifier 106 by means of a third switch (SW3; 112). A fourth switch (SW4) may be provided to enable and disable the transfer amplifier 106. In this manner, inadvertent discharge of the integration capacitor through the transfer amplifier 106 may be mitigated. The power consumption of the transfer amplifier 106 may also be mitigated.

The apparatus 100 may further comprise a controller 116 for synchronizing the operation of the switches SW1, SW2, SW3 and SW4. The controller 116 may also generate drive signals for controlling a light source 118 that produces the light that is incident on the photosensor 102. In one embodiment, the drive signals provided to the light source 118 are PWM drive signals.

During operation of the apparatus 100, and during a precharge phase ($T_{pre}$), the controller 116 may close the switch SW1 to precharge the integration capacitor ($C_{int}$) to the voltage $V_{precharge}$. See FIG. 3. If the switch SW1 is also closed during the precharge phase, then any parasitic capacitance associated with the photosensor 102 will also be precharged to the voltage $V_{precharge}$.

After the precharge phase, the controller 116 may cause the apparatus 100 to enter an integration phase ($T_{int}$). During the integration phase, the controller 116 opens the switch SW1 and closes (or keeps closed) the switch SW2. During the integration phase, a quantity of light incident on the photosensor 102 produces a current $I_{pd}$, which in turn causes the integration capacitor ($C_{int}$) to discharge, and causes the voltage $V_{cint}$ to decay. At the end of the integration phase, the voltage $V_{cint}$ will be proportional to the quantity of light that was incident on the photosensor 102 during the integration phase. However, the integration phase may not be so long, and the light incident on the photosensor 102 may not be so bright, as to cause the integration capacitor to completely discharge before the end of the integration phase.

Figure 3:
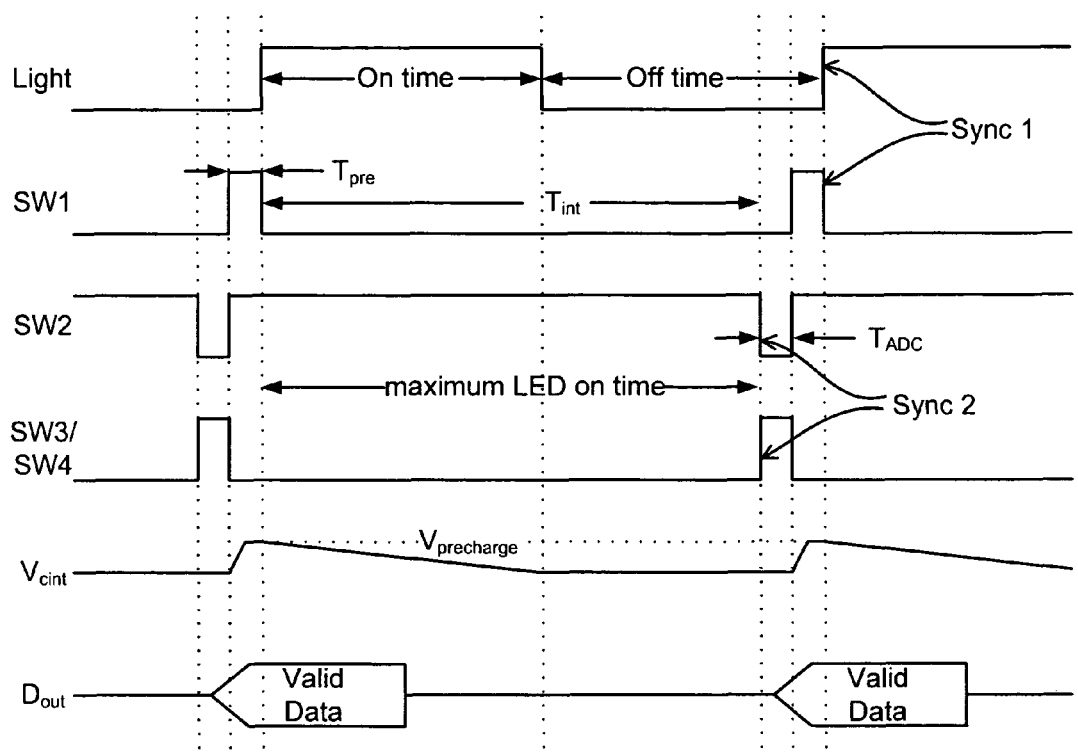
FIG. 3 illustrates various signal waveforms that may be received or produced by the circuit shown in FIG. 1 when the circuit is operated in accord with a first embodiment of the method shown in FIG. 2.
Figure 4:
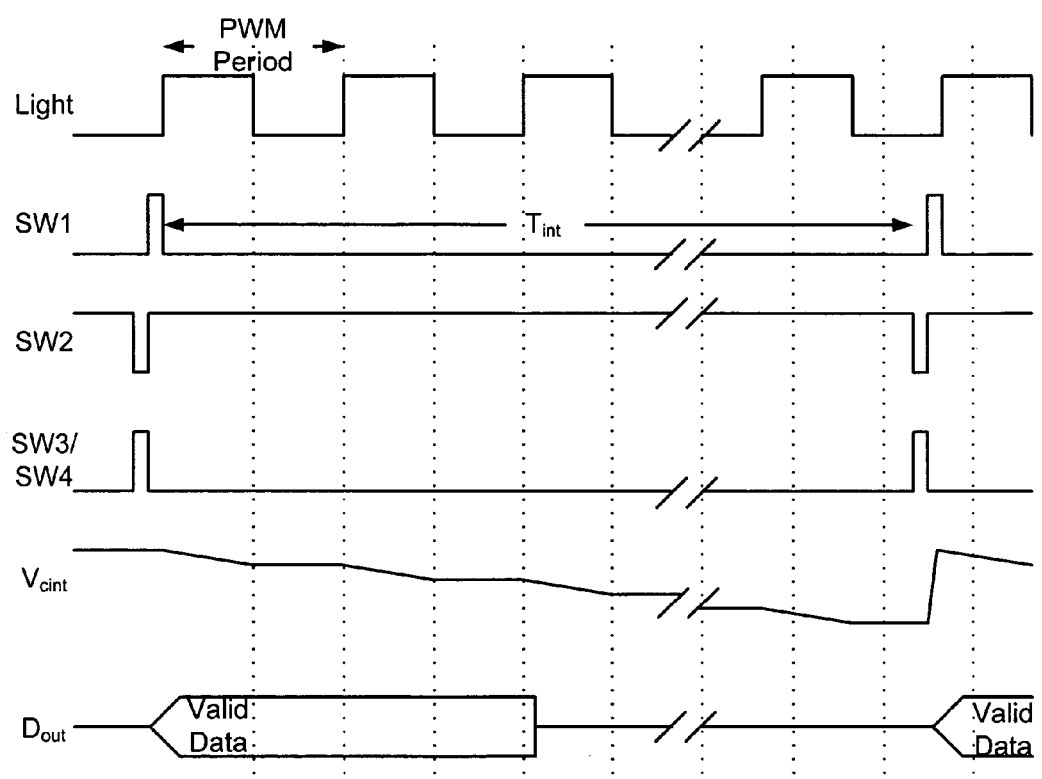
FIG. 4 illustrates various signal waveforms that may be received or produced by the circuit shown in FIG. 1 when the circuit is operated in accord with a second embodiment of the method shown in FIG. 2.

By varying the period and/or duty cycles at which the switches SW1 and SW2 are closed, the controller 116 may vary the length of the integration period ($T_{int}$). If the light source 118 produces a pulse-width modulated light, the period at which the switches SW1 and SW2 are closed is preferably synchronized to an integer multiple of the PWM period of the light. To this end, FIGS. 3 & 4 illustrate alternate exemplary timings for: the light, and signals controlling the switches SW1 and SW2. In FIG. 3, the period at which the switches SW1 and SW2 are closed corresponds to a single PWM period. In FIG. 4, the period at which the switches SW1 and SW2 are closed encompasses multiple PWM periods.

In some embodiments of the apparatus 100, the integration capacitor ($C_{int}$) may be provided with a programmable value, such as a digitally controlled value that may be set by means of one or more digital "Select" signals. See FIG. 1. In a similar manner, the size of the photosensor 102 could also be provided with a programmable size.

A structural advantage of the apparatus 100 is that its elements can be formed on a single integrated circuit or other semiconductor means. This is due, in part, to the elimination of the low-pass filter and large feedback resistor of the circuit shown in FIG. 6.

Figure 6:
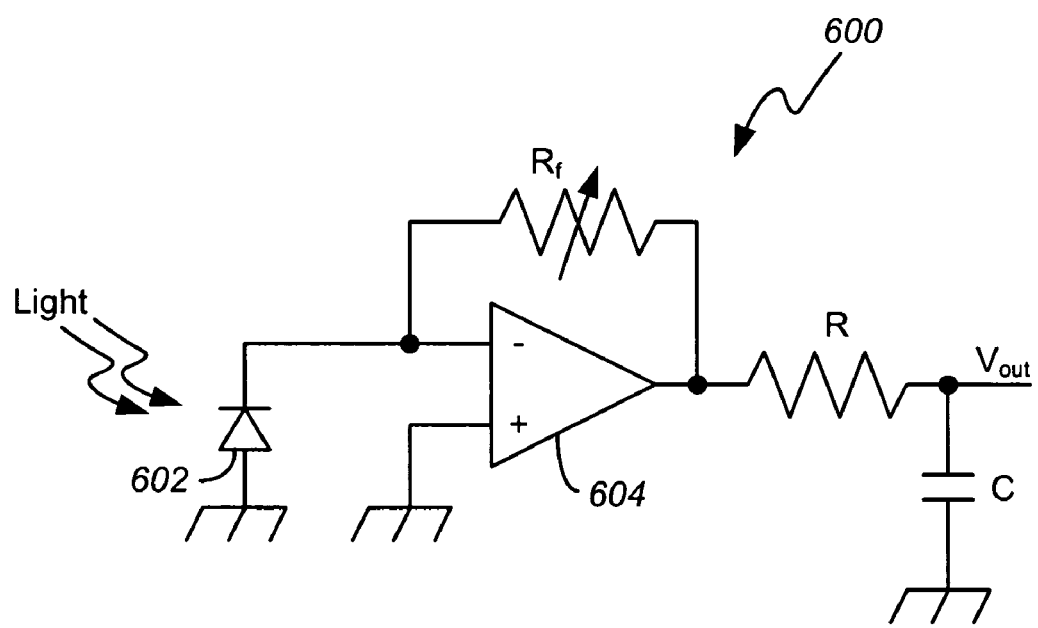
FIG. 6 illustrates an exemplary circuit for measuring an intensity of received light.

A functional advantage of the apparatus 100 is that it is better suited to integrating a pulsating light source (as compared to the circuit shown in FIG. 6). That is, if the light incident on the photosensor 102 is PWM light, and if the integration phase ($T_{int}$) is synchronized to a multiple of the PWM period (i.e., one or more periods), then the outputs $V_{out}$ and $D_{out}$ are proportional to the PWM duty cycle. The outputs $V_{out}$ and $D_{out}$ are also proportional to the voltage $V_{in}$, which is defined by the equation:

$$V_{in}=V_{precharge}-(I_{pd}*T_{int}/C_{int}) \quad (1)$$

As a result, the light-to-voltage gain of the apparatus 100 may be adjusted by means of three different mechanisms: 1) by programming the value of $C_{int}$; 2) by programming the size of the photosensor 102, thereby influencing the value of the current $I_{pd}$; or 3) by adjusting the length of $T_{int}$ (e.g., by increasing the length of $T_{int}$ when light is low, and vice versa).

Figure 2:
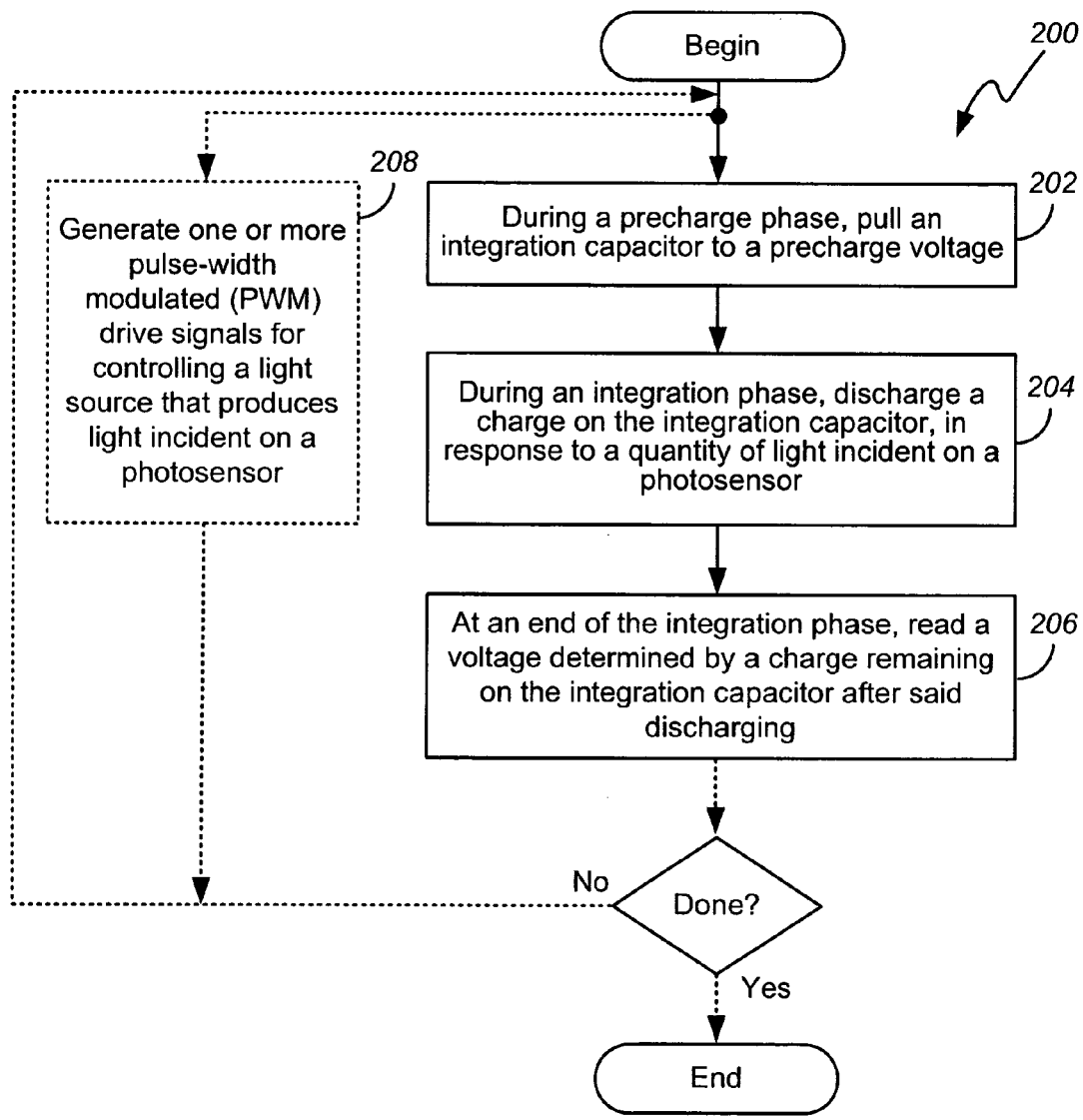
FIG. 2 illustrates an exemplary method for integrating a quantity of light.

FIG. 2 illustrates a method 200 for operating a circuit such as that which is shown in FIG. 1. The method 200 comprises, during a precharge phase, pulling an integration capacitor to a precharge voltage (see block 202). During an integration phase, and following the precharge phase, a charge on the integration capacitor is then discharged in response to a quantity of light that is incident on a photosensor (see block 204). At an end of the integration phase, a voltage determined by the charge remaining on the integration capacitor is read (see block 206). The actions recited in this paragraph may then be repeated over multiple cycles.

In one embodiment, the integration capacitor may be pulled to the precharge voltage by closing the switch SW1 (see FIG. 1, and the $T_{pre}$ phase in FIG. 3). The integration capacitor may be discharged by closing the switch SW2 during periods when switch SW1 is open (see FIG. 1, and the $T_{int}$ phase in FIG. 3). The voltage determined by the charge remaining on the integration capacitor, $V_{cint}$, may be read by temporarily closing switches SW3 and SW4 (see FIG. 1, and the $T_{ADC}$ phase in FIG. 3).

Referring back to FIG. 2, the method 200 may further comprise generating one or more PWM drive signals for controlling a light source that produces the light that is incident on the photosensor (see block 208). The integration phase of the method 200 may then be synchronized with an integer multiple of the period of the PWM drive signals.

FIG. 3 illustrates various signal waveforms that may be received or produced by the apparatus 100 and method 200. The signals comprise a pulsating light signal produced, for example, by an LED light source. The light signal has an "On time" and "Off time" as shown.

The waveforms labeled SW1, SW2, SW3 and SW4 control the similarly-named switches SW1, SW2, SW3 and SW4. Each of the signals is "active high", and thus closes its corresponding switch when in its "high" state.

The waveform SW1 causes the switch SW1 to close during a precharge phase ($T_{pre}$) and open otherwise. While switch SW1 is closed, switch SW2 may also be closed, thereby enabling $V_{cint}$ to be pulled to $V_{precharge}$. The waveform for $V_{cint}$ is shown in FIG. 3.

Subsequent to switch SW1 being opened, switch SW2 may remain closed, thereby beginning the integration phase ($T_{int}$) of the apparatus 100. In FIG. 3, the integration phase is timed to coincide with a single PWM period of a received light signal. In FIG. 4, the integration phase is timed to coincide with multiple PWM periods of a received light signal.

During the integration phase of the apparatus 100, the integration capacitor, $C_{int}$, is discharged to some degree each time the light source 118 causes light to fall incident on the photosensor 102. Under real-world operating conditions, the integration capacitor may also be discharged (but to a substantially lesser degree) during the "Off times" of a received light signal (e.g., because of ambient light and other effects).

Although FIG. 3 shows the falling edge of waveform SW1 to be synchronized with the rising edge of a received light's "On time" (see, "Sync 1"), in practice, it is preferable for switch SW1 to open just before the rising edge of the light's "On time". In this manner, the precharge voltage will not prevent the integration capacitor from discharging in response to received light.

As shown in FIG. 3, the "maximum LED on time", or LED duty cycle, that can be accommodated by the apparatus 100 is somewhat less than the length of the integration phase, $T_{int}$. This is because the precharge phase ($T_{pre}$) and a transfer phase ($T_{ADC}$) must be embedded within the "Off time" of a received light signal.

Following the integration phase ($T_{int}$), a transfer phase ($T_{ADC}$) begins. During the transfer phase, the switch SW2 is opened to avoid further discharge of the capacitor, $C_{int}$, and the switches SW3 and SW4 are closed to allow reading of the voltage $V_{cint}$ by the transfer amplifier 106. During or after the transfer phase, the ADC 114 may be enabled, thereby allowing the voltage $V_{out}$ to be converted to a digital value, $D_{out}$, and producing "Valid Data".

Although FIG. 3 shows the falling edge of waveform SW2 to be synchronized with the rising edge of waveform SW3/SW4 (see, "Sync 2"), in practice, it is preferable for waveform SW2 to fall just before the rising edge of waveform SW3/SW4. In this manner, the voltage $V_{cint}$ will be in a stable state as it is read by the transfer amplifier 106.

Following a transfer phase ($T_{ADC}$), the apparatus 100 may once again enter a precharge phase ($T_{pre}$).

The time that is allocated to the precharge and transfer phases ($T_{pre}$, $T_{ADC}$) of the apparatus 100 can vary. However, in some cases, their combined length may be kept very short, such as to 5% of the length of a PWM period.

The methods and apparatus disclosed herein have various applications, including the sensing and control of LCD backlighting for televisions, monitors, mobile phones, personal digital assistants, digital still cameras, and digital video cameras). The disclosed methods and apparatus are also useful for controlling other light sources, such as ambient or mood lighting.

Figure 5:
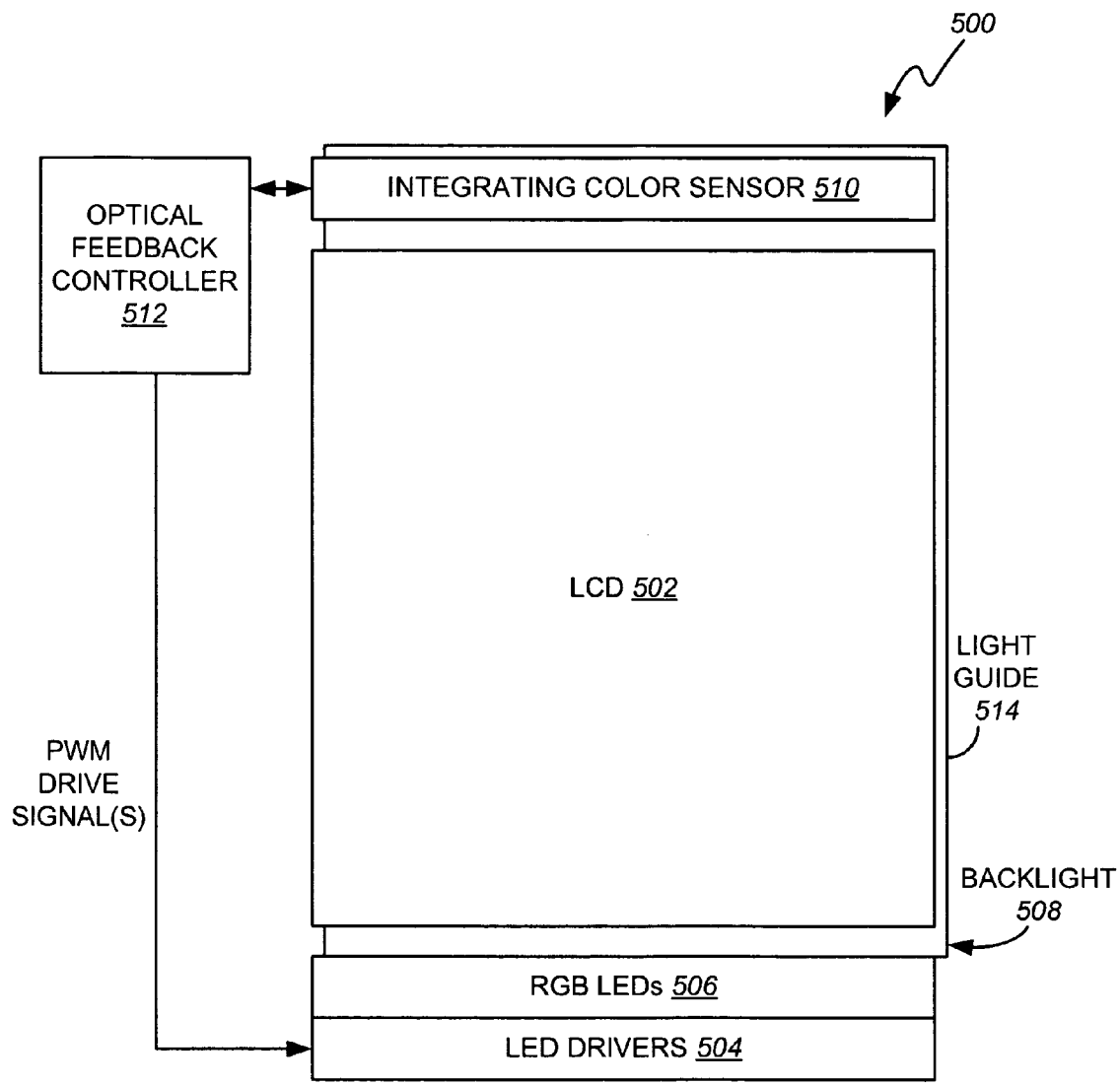
FIG. 5 illustrates an exemplary use of the apparatus shown in FIG. 1.

FIG. 5 illustrates one exemplary use of the apparatus 100 (FIG. 1). As shown in FIG. 5, a system 500 may comprise a backlight 508 that is positioned behind an LCD 502. By way of example, the backlight 508 may comprise red, green and blue (RGB) LEDs 506 that provide illumination to a light guide 514. The apparatus 100 may be distributed amongst an integrating color sensor 510 and an optical feedback controller 512. The integrating color sensor 510 may be positioned to sense the light emitted by the backlight 508, and may produce feedback for the optical feedback controller 512. In response to an intensity of light sensed by the integrating color sensor 510, the optical feedback controller 512 may generate PWM drive signals to control the LED drivers 504 associated with the RGB LEDs 506. Interaction between the integrating color sensor 510 and the optical feedback controller 512 ensures that PWM drive signals are properly synchronized with the light integrating phase of the color sensor 510. Preferably, both the color sensor 510 and the optical feedback controller 512 are integrated in a monolithic IC.

What is claimed is:

1. An apparatus configured to integrate a quantity of light, comprising:
   a photosensor;
   an integration capacitor;
   a transfer ampler comprising (i) an input coupled to receive a voltage determined by the integration capacitor, and (ii) an output;
   a first switch configured to pull the integration capacitor to a precharge voltage;
   a second switch configured to couple the integration capacitor to the photosensor, and to discharge the integration capacitor in proportion to a quantity of light that is incident on the photosensor; and
   a controller configured to (i) generate one or more pulse-width-modulated (PWM) drive signals for controlling a light source configured to produce the light incident on the photosensor, and (ii) synchronize opening and closing of the first and second switches with an integer multiple of a PWM period of the PWM drive signals,
   wherein the apparatus is disposed on a single integrated circuit.

2. The apparatus of claim 1, wherein the photosensor is a photodiode.

3. The apparatus of claim 1, wherein the photosensor has a programmable size.

4. The apparatus of claim 1, wherein the integration capacitor has a programmable value.

5. The apparatus of claim 1, further comprising, an analog-to-digital converter, configured to receive and convert the output of the transfer amplifier to a digital value.

6. The apparatus of claim 1, wherein the integer multiple of the PWM period is programmable to control a light-to-voltage gain.

7. The apparatus of claim 1, further comprising a third switch configured to and de-couple the input of the transfer amplifier to the integration capacitor.

8. The apparatus of claim 1, further comprising a third switch configured to enable and disable the transfer amplifier.

9. The apparatus of claim 1, further comprising:
   a third switch configured to couple and de-couple the input of the transfer amplifier to the integration capacitor; and
   a fourth switch configured to enable and disable the transfer amplifier.

10. The apparatus of claim 9, wherein
    the controller is further configured to synchronize opening and closing of the first, second, third and fourth switches with the integer multiple of the PWM period of the PWM drive signals.

11. The apparatus of claim 1, wherein the light source comprises a plurality of LEDs controlled by one or more of PWM drive signals.

12. The apparatus of claim 11, wherein the plurality of LEDs are arranged to provide backlighting for a display, and wherein the photosensor is positioned to sense an intensity of said backlighting.

13. The apparatus of claim 1, further comprising a filter to limit a range of wavelengths of light sensed by the photosensor.

14. A method for integrating a quantity of light, comprising:
    disposing, on a single integrated circuit, an integration capacitor, a photosensor, means for discharging the capacitor, means for reading a voltage on the capacitor, and means for generating pulse-width-modulation (PWM) drive signals;
    during a precharge phase, pulling the integration capacitor to a precharge voltage;
    during an integration phase, following the precharge phase, discharging a charge on the integration capacitor in response to a quantity of light incident on the photosensor;
    at an end of the integration phase, reading the voltage determined by a charge remaining on the integration capacitor after discharging the capacitor;
    generating one or more PWM drive signals for controlling a light source that produces the light incident on the photosensor, the PWM drive signals having a PWM period;
    synchronizing the integration phase with an integer multiple of the PWM period.

15. The method of claim 14, further comprising, subsequent to reading the voltage determined by the charge remaining on the integration capacitor, repeating additional cycles of said pulling, discharging and reading.

16. The method of claim 14, further comprising, converting the voltage read to a digital value.

17. The method of claim 14, further comprising, programming a value of the integration capacitor.

18. The method of claim 14, further comprising, programming a size of the photosensor.

* * * * *